US009728569B2

(12) United States Patent
Sato

(10) Patent No.: US 9,728,569 B2
(45) Date of Patent: Aug. 8, 2017

(54) SOLID-STATE IMAGING DEVICE AND ELECTRONIC APPARATUS

(71) Applicant: SONY CORPORATION, Tokyo (JP)

(72) Inventor: Naoyuki Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/892,314

(22) PCT Filed: May 19, 2014

(86) PCT No.: PCT/JP2014/063209
§ 371 (c)(1),
(2) Date: Nov. 19, 2015

(87) PCT Pub. No.: WO2014/192576
PCT Pub. Date: Dec. 4, 2014

(65) Prior Publication Data
US 2016/0093651 A1    Mar. 31, 2016

(30) Foreign Application Priority Data

May 31, 2013    (JP) .................................. 2013-115798

(51) Int. Cl.
*H01L 27/14*        (2006.01)
*H01L 27/146*       (2006.01)
(Continued)

(52) U.S. Cl.
CPC .... *H01L 27/1463* (2013.01); *H01L 21/76229* (2013.01); *H01L 27/1461* (2013.01);
(Continued)

(58) Field of Classification Search
CPC ........... H01L 27/1463; H01L 27/14605; H01L 27/1461; H01L 27/14612; H01L 27/14638; H01L 27/14643; H01L 27/14689
See application file for complete search history.

(56) References Cited

U.S. PATENT DOCUMENTS 7,518,172 B2 * 4/2009 Moon ............... H01L 27/14625
257/292
7,705,381 B2 * 4/2010 Shinohara ......... H01L 27/14609
257/233
(Continued)

FOREIGN PATENT DOCUMENTS

JP    2002-118249 A    4/2002
JP    2003-78002 A     3/2003
(Continued)

OTHER PUBLICATIONS

International Search Report prepared by the Japanese Patent Office on Aug. 7, 2014, for International Application No. PCT/JP2014/063209.
(Continued)

*Primary Examiner* — Ida M Soward
(74) *Attorney, Agent, or Firm* — Sheridan Ross P.C.

(57) ABSTRACT

The present disclosure relates to a solid-state imaging device, an electronic apparatus, and a manufacturing method that are designed to further increase conversion efficiency. A solid-state imaging device includes a pixel in which element separation is realized by a first trench element separation region having a trench structure in a region between an FD unit and an amplifying transistor among element separation elements separating the elements constituting the pixel from one another, and a second trench element separation region having a trench structure in a region other than the region between the FD unit and the amplifying transistor among the
(Continued)

element separation regions separating the elements constituting the pixel from one another, and the first trench element separation region is deeper than the second trench element separation region. The present technology can be applied to CMOS image sensors, for example.

5 Claims, 8 Drawing Sheets

(51) Int. Cl.
    *H04N 5/3745*     (2011.01)
    *H01L 21/762*     (2006.01)

(52) U.S. Cl.
    CPC .. *H01L 27/14605* (2013.01); *H01L 27/14612* (2013.01); *H01L 27/14638* (2013.01); *H01L 27/14643* (2013.01); *H01L 27/14689* (2013.01); *H04N 5/3745* (2013.01)

(56) References Cited

U.S. PATENT DOCUMENTS

| | | | | |
|---|---|---|---|---|
| 8,436,406 B2 * | 5/2013 | Shinohara | ......... | H01L 27/14609 257/233 |
| 8,946,794 B2 * | 2/2015 | Ahn | ......... | H01L 31/02 257/239 |
| 8,953,076 B2 * | 2/2015 | Ikeda | ......... | H01L 27/14609 250/206 |
| 9,006,080 B2 * | 4/2015 | Chou | ......... | H01L 21/76229 257/510 |
| 9,054,002 B2 * | 6/2015 | Arakawa | ......... | H01L 27/14627 |
| 9,054,003 B2 * | 6/2015 | Ahn | ......... | H01L 27/1463 |
| 9,123,603 B2 * | 9/2015 | Kobayashi | ......... | H01L 27/1461 |
| 2011/0269259 A1 * | 11/2011 | Tatani | ......... | H01L 27/14831 438/73 |
| 2012/0025199 A1 * | 2/2012 | Chen | ......... | H01L 27/1464 257/75 |
| 2013/0321685 A1 * | 12/2013 | Ahn | ......... | H04N 5/374 348/308 |
| 2014/0016012 A1 * | 1/2014 | Oishi | ......... | H04N 5/372 348/311 |
| 2014/0035083 A1 * | 2/2014 | Wan | ......... | H01L 27/14634 257/432 |
| 2016/0360139 A1 * | 12/2016 | Shimotsusa | ......... | H01L 27/14609 |

FOREIGN PATENT DOCUMENTS

| | | |
|---|---|---|
| JP | 2008-205022 A | 9/2008 |
| JP | 2010-87369 A | 4/2010 |
| JP | 2012-119349 A | 6/2012 |

OTHER PUBLICATIONS

Official Action (no English translation available) for Japanese Patent Application No. 2013115798 mailed Aug. 16, 2016, 8 pages.

\* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2014/063209 having an international filing date of May 19, 2014, which designated the United States, which PCT application claimed the benefit of Japanese Patent Application No. 2013-115798 filed May 31, 2013, the disclosures of which are incorporated herein by reference in their entirety.

TECHNICAL FIELD

The present disclosure relates to solid-state imaging devices, electronic apparatuses, and manufacturing methods, and more particularly, to a solid-state imaging device, an electronic apparatus, and a manufacturing method that are designed to further increase conversion efficiency.

BACKGROUND ART

In a conventional electronic apparatus having an imaging function, such as a digital still camera or a digital video camera, a solid-state imaging device like a CCD (Charge Coupled Device) or a CMOS (Complementary Metal Oxide Semiconductor) image sensor is used. A solid-state imaging device has pixels each including a combination of a photodiode that performs photoelectric conversion and transistors, and an image is formed based on pixel signals that are output from the pixels arranged in a two-dimensional fashion.

In a solid-state imaging device, for example, charge accumulated in a photodiode is transferred to an FD (Floating Diffusion) unit that has a predetermined capacity and is provided at the connecting unit between the photodiode and the gate electrode of an amplifying transistor. A signal at the level corresponding to the charge stored in the FD unit is read from the pixel, and is subjected to AD conversion at an AD (Analog Digital) conversion circuit having a comparator. The resultant signal is then output.

In recent years, there has been a demand for a decrease in the charge capacity of each FD unit and an increase in the conversion efficiency of each pixel device, so as to increase the sensitivity characteristics of a solid-state imaging device and obtain low-illuminance characteristics similar to those of an ultrasensitive image sensor.

For example, Patent Document 1 discloses a technology by which only the element separation regions in contact with FD units have trench structures, and the other element separation regions are formed with diffusion element separation regions, so as to cope with the small-sized pixels of MOS image sensors, and increase conversion efficiency while preventing generation of dark current and appearance of white dots.

CITATION LIST

Patent Document

Patent Document 1: JP 2008-205022 A

SUMMARY OF THE INVENTION

Problems to be Solved by the Invention

Although conversion efficiency is increased by conventional methods as described above, there is a demand for a further increase in conversion efficiency.

The present disclosure is made in view of those circumstances, and is to further increase conversion efficiency.

Solutions to Problems

A solid-state imaging device according to an aspect of the present disclosure includes a pixel including elements including at least: a photoelectric conversion unit that converts light into charge; a transfer transistor that transfers the charge generated at the photoelectric conversion unit; a floating diffusion region that temporarily accumulates the charge generated at the photoelectric conversion unit; and an amplifying transistor that amplifies the charge accumulated in the floating diffusion region, and outputs a pixel signal at a level corresponding to the charge. In the pixel, element separation is realized by a first trench element separation region having a trench structure in a region between the floating diffusion region and the amplifying transistor among element separation regions separating the elements constituting the pixel from one another, and a second trench element separation region having a trench structure in a region other than the region between the floating diffusion region and the amplifying transistor among the element separation regions separating the elements constituting the pixel from one another, and the first trench element separation region is deeper than the second trench element separation region.

An electronic apparatus according to an aspect of the present disclosure includes a solid-state imaging device. The solid-state imaging device includes a pixel including elements including at least: a photoelectric conversion unit that converts light into charge; a transfer transistor that transfers the charge generated at the photoelectric conversion unit; a floating diffusion region that temporarily accumulates the charge generated at the photoelectric conversion unit; and an amplifying transistor that amplifies the charge accumulated in the floating diffusion region, and outputs a pixel signal at a level corresponding to the charge. In the pixel, element separation is realized by a first trench element separation region having a trench structure in a region between the floating diffusion region and the amplifying transistor among element separation regions separating the elements constituting the pixel from one another, and a second trench element separation region having a trench structure in a region other than the region between the floating diffusion region and the amplifying transistor among the element separation regions separating the elements constituting the pixel from one another, and the first trench element separation region is deeper than the second trench element separation region.

A manufacturing method according to an aspect of the present disclosure includes the steps of: performing first etching to form a trench in a region where the first trench element separation region and the second trench element separation region are to be formed, the trench having a depth of the second trench element separation region; and performing second etching to form a trench in a region where the first trench element separation region is to be formed, the trench having a depth of the first trench element separation region.

A solid-state imaging device according to an aspect of the present disclosure is manufactured by a manufacturing method that includes the steps of: performing first etching to form a trench in a region where the first trench element separation region and the second trench element separation region are to be formed, the trench having a depth of the second trench element separation region; and performing second etching to form a trench in a region where the first trench element separation region is to be formed, the trench having a depth of the first trench element separation region.

In an aspect of the present disclosure, a first trench element separation region is designed to be deeper than a second trench element separation region.

Effects of the Invention

According to one aspect of the present disclosure, conversion efficiency can be further increased.

MODES FOR CARRYING OUT THE INVENTION

The following is a detailed description of specific embodiments to which the present technology is applied, with reference to the drawings.

Figure 1:
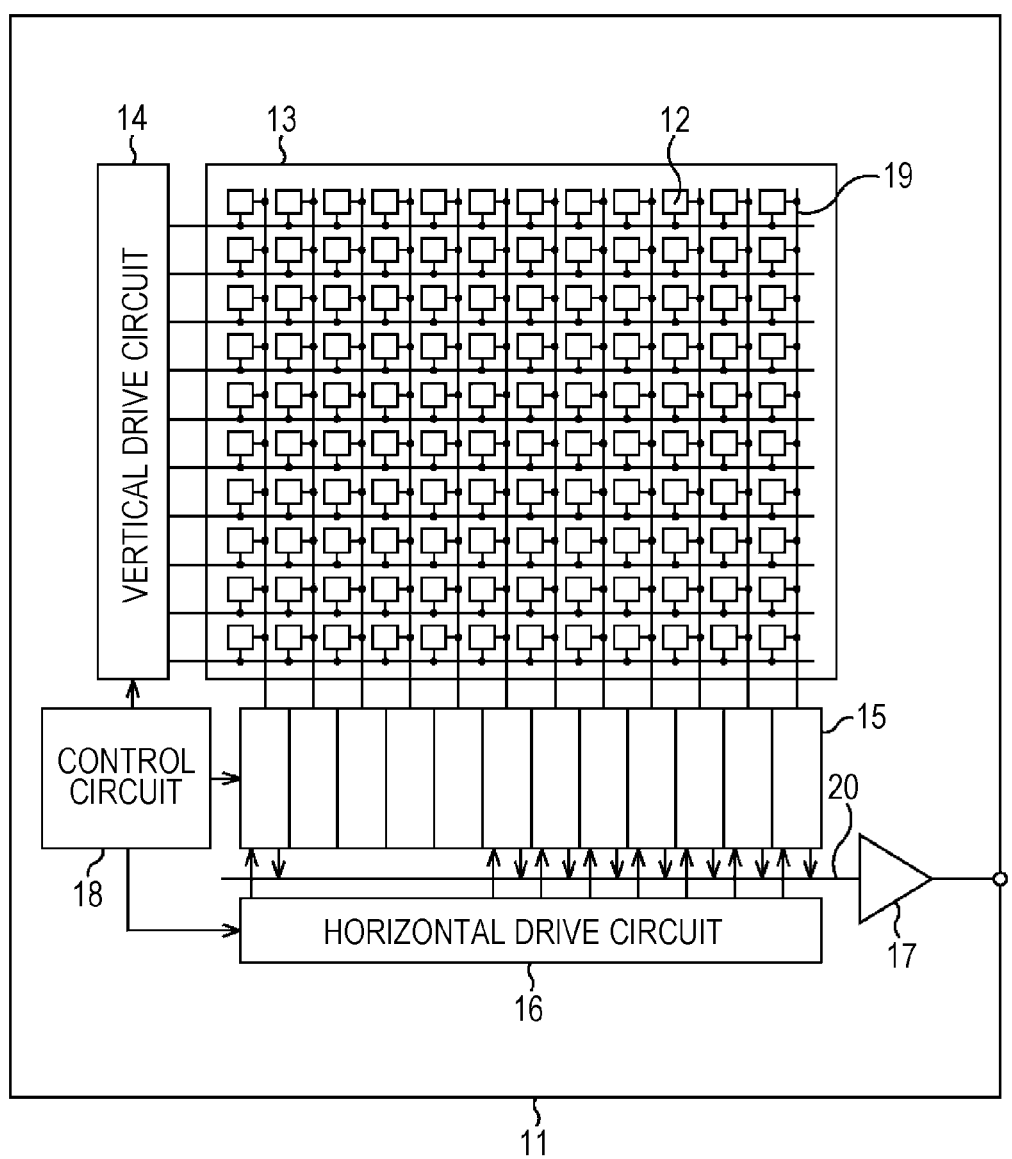
FIG. 1 is a block diagram showing an example structure of an embodiment of a solid-state imaging device to which the present technology is applied.

FIG. 1 is a block diagram showing an example structure of an embodiment of a solid-state imaging device to which the present technology is applied.

As shown in FIG. 1, a solid-state imaging device 11 includes an array unit 13 having pixels 12 arranged in an array, a vertical drive circuit 14, a column signal processing circuit 15, a horizontal drive circuit 16, an output circuit 17, and a control circuit 18.

As will be described later with reference to FIG. 2, the pixels 12 each include a PD 31 that is a photoelectric conversion unit, and a pixel signal at the level corresponding to the charge generated by the PD 31 receiving light is read out to the column signal processing circuit 15 via the vertical signal line 19.

The array unit 13 is formed by arranging the pixels 12 in an array.

The vertical drive circuit 14 sequentially supplies a drive signal for driving (or transferring a signal to, selecting, resetting, or the like) the respective pixels 12 in each of the rows of pixels 12 in the array unit 13 via horizontal signal lines.

The column signal processing circuit 15 extracts the signal levels of the pixel signals by performing CDS (Correlated Double Sampling) on the pixel signals output from the respective pixels 12 via the vertical signal lines 19, and acquires pixel data in accordance with the amounts of light received by the pixels 12.

The horizontal drive circuit 16 sequentially supplies, to the column signal processing circuit 15, the drive signals for outputting the pixel data acquired from the respective pixels 12 from the column signal processing circuit 15 for each column of the pixels 12 in the array unit 13.

The pixel data output from the column signal processing circuit 15 at the times in accordance with the drive signals from the horizontal drive circuit 16 is supplied to the output circuit 17 via a horizontal signal line 20, and the output circuit 17 amplifies the pixel data, for example, and outputs the pixel data to an image processing circuit in a later stage.

The control circuit 18 controls driving of the respective block in the solid-state imaging device 11. For example, the solid-state imaging device 11 generates clock signals in accordance with the drive cycles of the respective blocks, and supplies the clock signals to the respective blocks.

Figure 2:
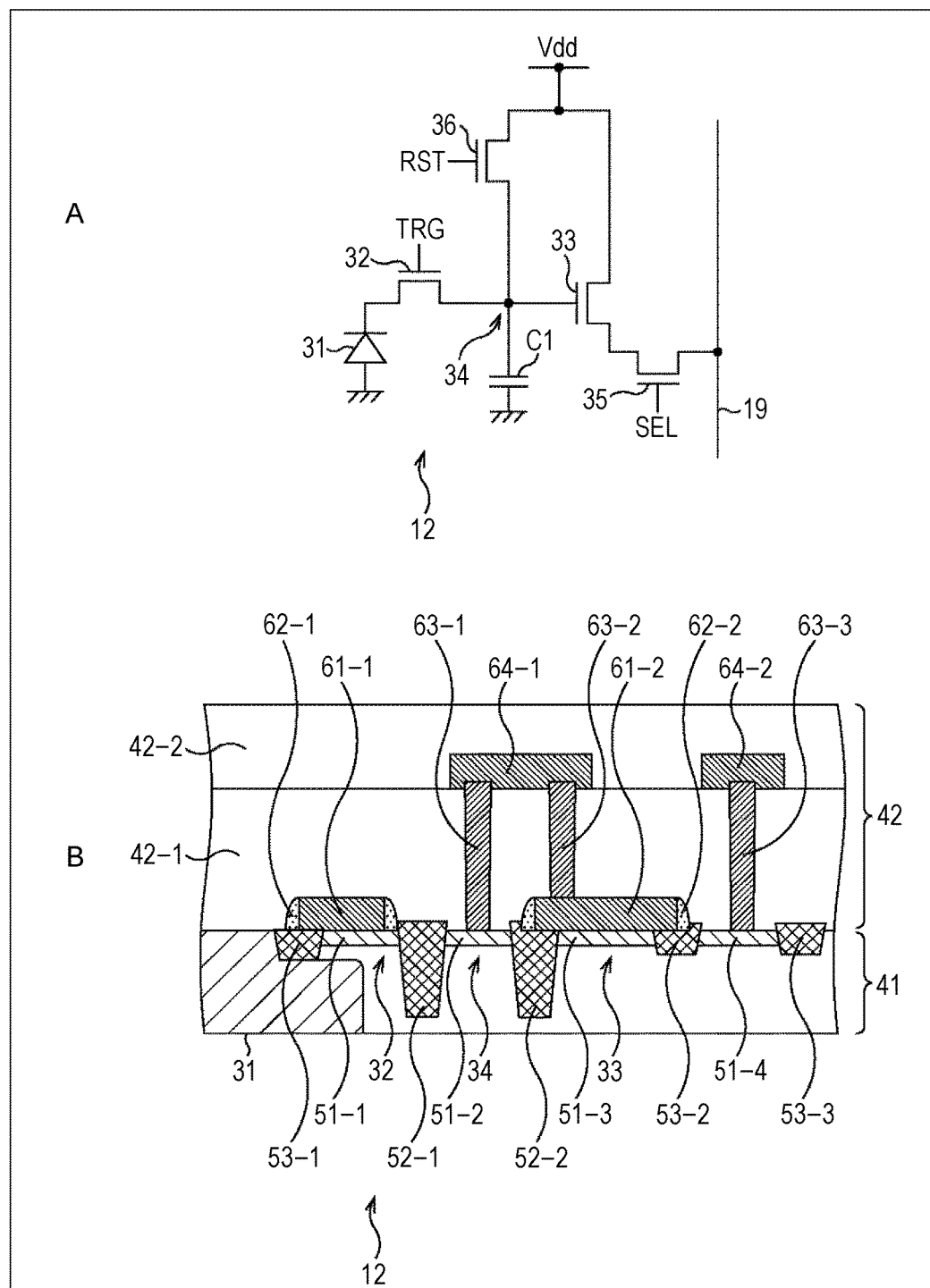
FIG. 2 is a circuit diagram and a cross-sectional diagram showing a first example structure of a pixel.

Referring now to FIG. 2, a first example structure of a pixel 12 is described.

A in FIG. 2 is a circuit diagram showing the circuit configuration of the pixel 12, and B in FIG. 2 is a cross-sectional view of the example structure of the pixel 12.

As shown in A in FIG. 2, the pixel 12 includes a PD (photodiode) 31, a transfer transistor 32, an amplifying transistor 33, an FD (Floating Diffusion) unit 34, a select transistor 35, and a reset transistor 36.

The PD 31 is a photoelectric conversion unit that converts light into charge, and generates and accumulates charge in accordance with the amount of received light through photoelectric conversion. The anode electrode of the PD 31 is grounded, and the cathode electrode of the PD 31 is connected to the gate electrode of the amplifying transistor 33 via the transfer transistor 32.

The transfer transistor 32 is driven in accordance with a transfer signal TRG supplied from the vertical drive circuit 14 shown in FIG. 1. For example, when the transfer signal TRG supplied to the gate electrode of the transfer transistor 32 switches to high level, the transfer transistor 32 is switched on, and the charge accumulated in the PD 31 is transferred to the FD unit 34 via the transfer transistor 32.

The amplifying transistor 33 serves as the input unit for a source follower that is a readout circuit that reads out a signal obtained through photoelectric conversion performed at the PD 31, and outputs a pixel signal at the level corresponding to the charge accumulated in the FD unit 34, to the vertical signal line 19. That is, the amplifying transistor 33 has its source electrode connected to the vertical signal line 19 via the select transistor 35, to form a source follower together with a current source (not shown) connected to one end of the vertical signal line 19.

The FD unit 34 is a floating diffusion region that includes a charge capacity C1 and is provided between the transfer transistor 32 and the amplifying transistor 33, and temporarily accumulates charge transferred from the PD 31 via the transfer transistor 32. The FD unit 34 is the charge detecting unit that converts charge into voltage, and the charge stored in the FD unit 34 is converted into voltage at the amplifying transistor 33.

The select transistor 35 is driven in accordance with a select signal SEL supplied from the vertical drive circuit 14 shown in FIG. 1. For example, when the select signal SEL supplied to the gate electrode of the select transistor 35 is turned on or is switched to high level, the amplifying transistor 33 and the vertical signal line 19 are connected.

The reset transistor 36 is driven in accordance with a reset signal RST supplied from the vertical drive circuit 14 shown in FIG. 1. For example, when the reset signal RST supplied to the gate electrode of the reset transistor 36 is turned on or is switched to high level, the charge accumulated in the FD unit 34 is released to a source voltage Vdd, so that the FD unit 34 is reset.

As shown in B in FIG. 2, in a cross-sectional view of the structure of the pixel 12, an interconnect layer 42 is stacked on a silicon substrate 41.

The PD 31 is formed in the silicon substrate 41 with a structure called a HAD (Hole Accumulation Diode) structure, for example, and is formed through ion implantation and annealing. The PD 31 is also formed so as to extend in a deeper region than the portion in which a shallow trench element separation region 53-1 formed in a later step than the step of forming the PD 31. Accordingly, the region where the PD 31 is formed is increased. As a result, the saturation charge quantity Qs of the PD 31 can be increased.

A thin p-type region 51-1, a thick n-type region 51-2, a thin n-type region 51-3, and a thin n-type region 51-4 are formed in the surface of the silicon substrate 41 on the side on which the interconnect layer 42 is stacked on the p-type silicon substrate 41 (p-well). The thin p-type region 51-1 is formed in accordance with the portion where the transfer transistor 32 is formed, the thick n-type region 51-2 is formed in accordance with the portion where the FD unit 34 is formed, and the thin n-type region 51-3 is formed in accordance with the portion where the amplifying transistor 33 is formed.

So as to separate the elements constituting the pixel 12 from one another in the silicon substrate 41, trenches are formed in the silicon substrate 41, and an oxide film is buried in each of the trenches to form trench element separation regions. As shown in B in FIG. 2, deep trench element separation regions 52-1 and 52-2, and shallow trench element separation regions 53-1 through 53-3 are formed as the trench element separation regions.

The deep trench element separation regions 52-1 and 52-2 separate the FD unit 34 from the other elements, and are formed in portions adjacent to the FD unit 34. For example, the deep trench element separation region 52-1 is formed in a portion located between the FD unit 34 and the transfer transistor 32, and the deep trench element separation region 52-2 is formed in a portion located between the FD unit 34 and the amplifying transistor 33. The shallow trench element separation regions 53-1 through 53-3 separate the elements other than the FD unit 34 from one another. For example, the shallow trench element separation region 53-1 is formed in a portion located between the PD 31 and the transfer transistor 32.

The gate electrode 61-1 forming the transfer transistor 32, and the gate electrode 61-2 forming the amplifying transistor 33 are stacked, via an insulating film (not shown), on the surface of the silicon substrate 41 on the side on which the interconnect layer 42 is stacked on the silicon substrate 41. Sidewalls 62-1 are formed on the side surfaces of the gate electrode 61-1, and sidewalls 62-2 are formed on the side surfaces of the gate electrode 61-2.

The interconnect layer 42 is formed with interconnects placed between interlayer insulating films. In the example structure shown in B in FIG. 2, a first interlayer insulating film 42-1 and a second interlayer insulating film 42-2 are stacked, and interconnects 64-1 and 64-2 are placed between the first interlayer insulating film 42-1 and the second interlayer insulating film 42-2.

Contact portions 63-1 through 63-3 are formed so as to extend through the first interlayer insulating film 42-1. The contact portion 63-1 is formed so as to connect the FD unit 34 and the interconnect 64-1, and the contact portion 63-2 is formed so as to connect the interconnect 64-1 and the gate electrode 61-2 forming the amplifying transistor 33. The contact portion 63-3 is formed so as to connect the thin n-type region 51-4 and the interconnect 64-2.

The pixel 12 has the above structure, and element separation is realized by the deep trench element separation regions 52-1 and 52-2 and the shallow trench element separation regions 53-1 through 53-3, so that the elements constituting the pixel 12 can be certainly separated from one another.

Further, in the pixel 12, the deep trench element separation region 52-2 is formed in the element separation region in contact with the FD unit 34 and the gate electrode 61-2 of the amplifying transistor 33, so that coupling between the amplifying transistor 33 and the silicon substrate 41 (p-well) can be restrained. Accordingly, conversion efficiency can be increased.

The shallow trench element separation regions 53-1 through 53-3 are formed in the element separation regions other than the portions adjacent to the FD unit 34, so that the amplifier capacity becomes lower than that in the case of conventional diffusion separation. Accordingly, conversion efficiency can be increased.

Also, as the element separation is conducted through the trench formation, the element separation regions can be made smaller than those in the case of conventional diffusion separation. Accordingly, the area of the PD 31 can be made larger, and the saturation charge quantity Qs can be increased, for example.

Also, in the pixel 12, the shallow trench element separation region 53-1 is used in separating the PD 31 and the transfer transistor 32 from each other, so that the PD 31 can be designed to extend in a deeper region than the shallow trench element separation region 53-1. Accordingly, the saturation charge quantity Qs of the PD 31 can be increased.

Figure 3:
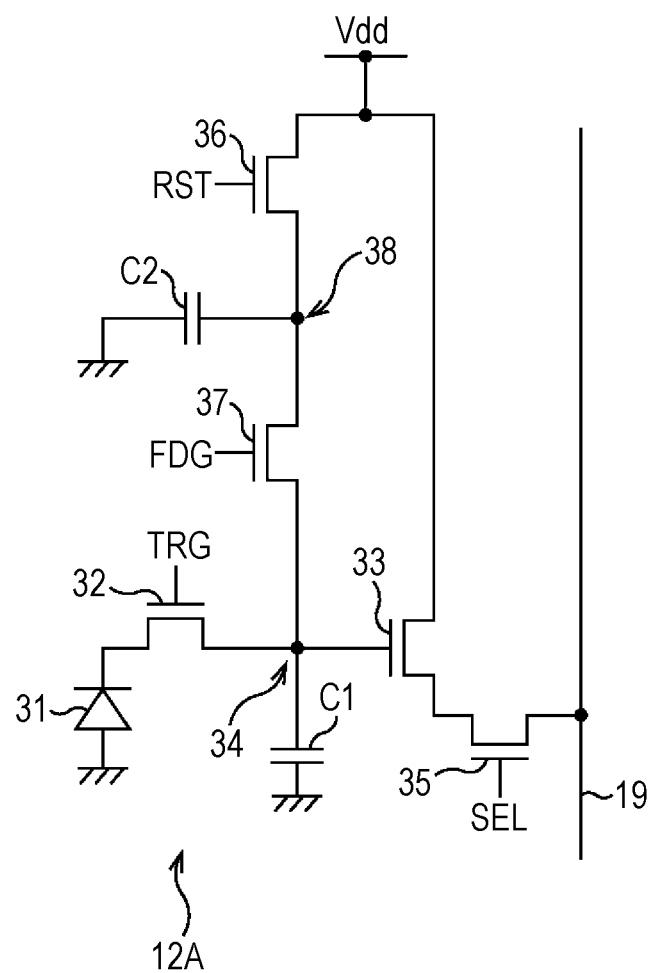
FIG. 3 is a circuit diagram showing a second example structure of a pixel.

FIG. 3 is a circuit diagram showing a second example structure of a pixel 12.

As shown in FIG. 3, a pixel 12A includes a PD 31, a transfer transistor 32, an amplifying transistor 33, an FD unit 34, a select transistor 35, a reset transistor 36, a separation transistor 37, and an FD unit 38. That is, the pixel 12A is the same as the pixel 12 shown in FIG. 2, including the PD 31, the transfer transistor 32, the amplifying transistor 33, the FD unit 34, the select transistor 35, and the reset transistor 36, and detailed explanation of these components will not be repeated.

The separation transistor 37 is placed so as to connect the FD unit 34 and the reset transistor 36, and the FD 38 is provided at the connecting portion between the separation transistor 37 and the reset transistor 36. The FD unit 38 is a floating diffusion region including a charge capacity C2.

The separation transistor 37 is switched on or off in accordance with a separation signal FDG. For example, when the separation signal FDG is switched to high level, the separation transistor 37 is switched on, and the FD unit 34 and the FD unit 38 are connected. That is, while the separation transistor 37 is on, the charge generated in the PD 31 at a charge capacity that is the sum of the charge capacity C1 of the FD unit 34 and the charge capacity C2 of the FD unit 38 can be accumulated. When the separation signal FDG is switched to low level, on the other hand, the separation transistor 37 is switched off, and the FD unit 34 and the FD unit 38 are separated from each other. In this case, the charge generated in the PD 31 is accumulated only in the FD unit 34.

As described above, by controlling the switching on and off of the separation transistor 37, the pixel 12A can change the charge capacity at which the charge generated in the PD 31 is to be accumulated. With this, the gain in the amplifying transistor 33 can be changed. Accordingly, by switching on and off the separation transistor 37 in accordance with a high-illuminance signal and a low-illuminance signal, for example, the pixel 12A can realize an excellent S/N ratio, and appropriately remove reset noise.

In the pixel 12A having the above structure, a deep trench element separation region 52 separates the FD unit 34 and the FD unit 38 from the other elements as in the pixel 12 shown in FIG. 2, so that conversion efficiency can be increased.

Figure 4:
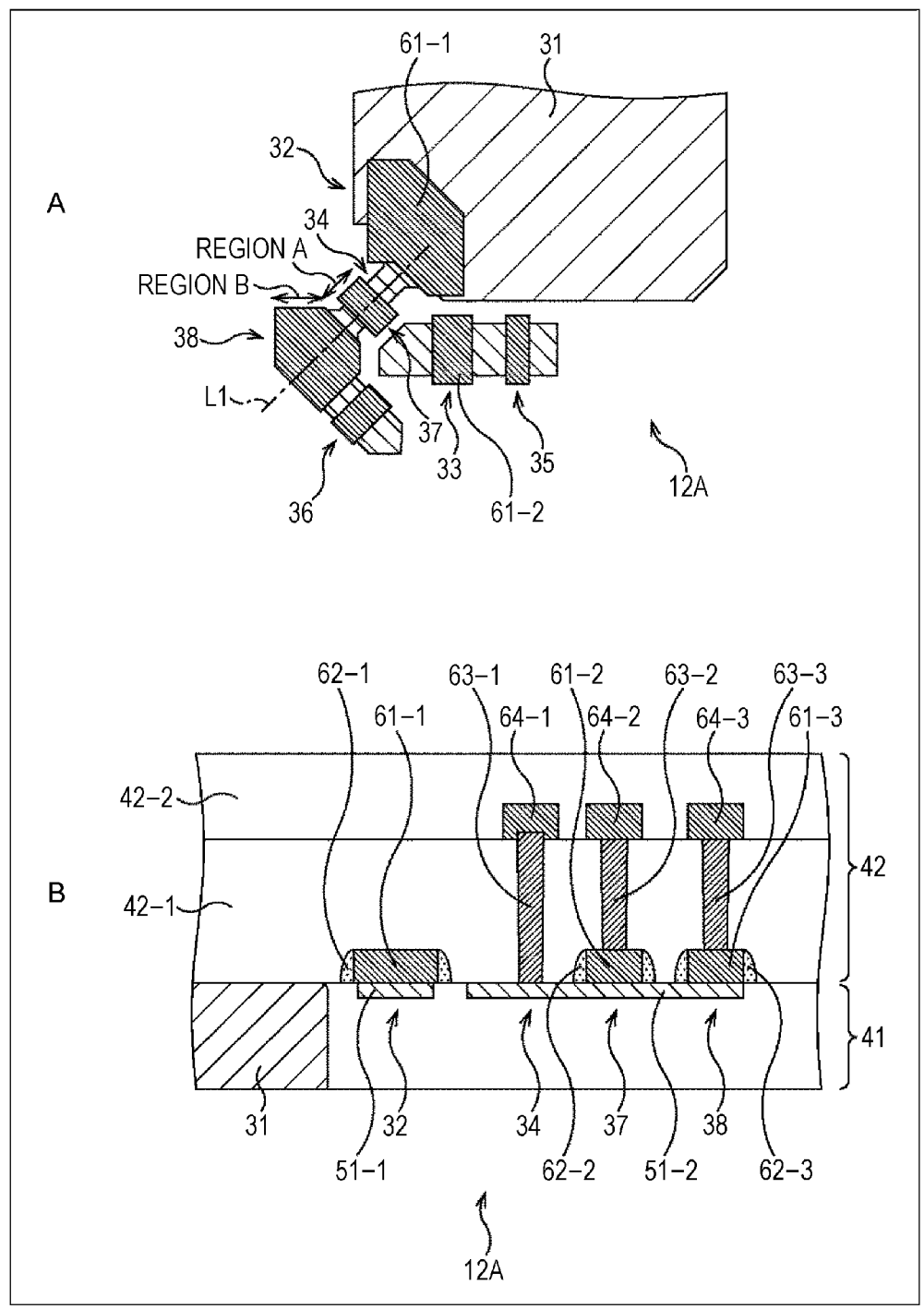
FIG. 4 is a plan view and a cross-sectional diagram showing the second example structure of a pixel.

A in FIG. 4 is a plan view of the structure of the pixel 12A, and B in FIG. 4 is a cross-sectional view of the structure of the pixel 12A, taken along the dot-and-dash line L1 shown in A in FIG. 4.

In the pixel 12A, a deep trench element separation region 52 is formed in a region adjacent to the FD unit 34 and the FD unit 38, and a shallow trench element separation region 53 is formed in a region other than the region adjacent to the FD unit 34 and the FD unit 38, for example. That is, the element separation for the FD unit 34 and the FD unit 38 is realized by the deep trench element separation region 52. In the description below, the region that is adjacent to the FD unit 34 and the FD unit 38 and realizes the element separation will be referred to as the region A, and the region that is a region other than the region A and realizes element separation will be referred to as the region B, where appropriate. It should be noted that the deep trench element separation region 52 and the shallow trench element separation region 53 are formed behind the portion shown in the cross-sectional view in B in FIG. 4.

Figure 5:
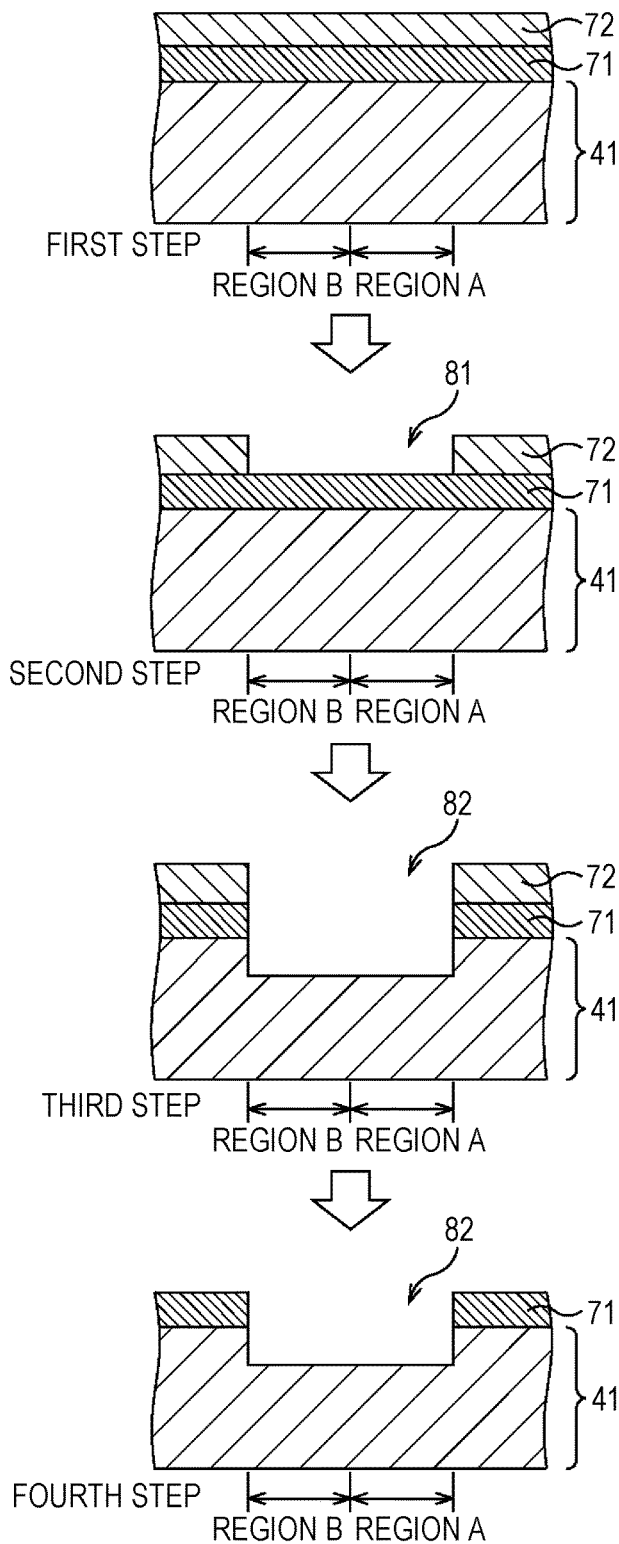
FIG. 5 is a diagram for explaining first through fourth steps according to a pixel manufacturing method.
Figure 6:
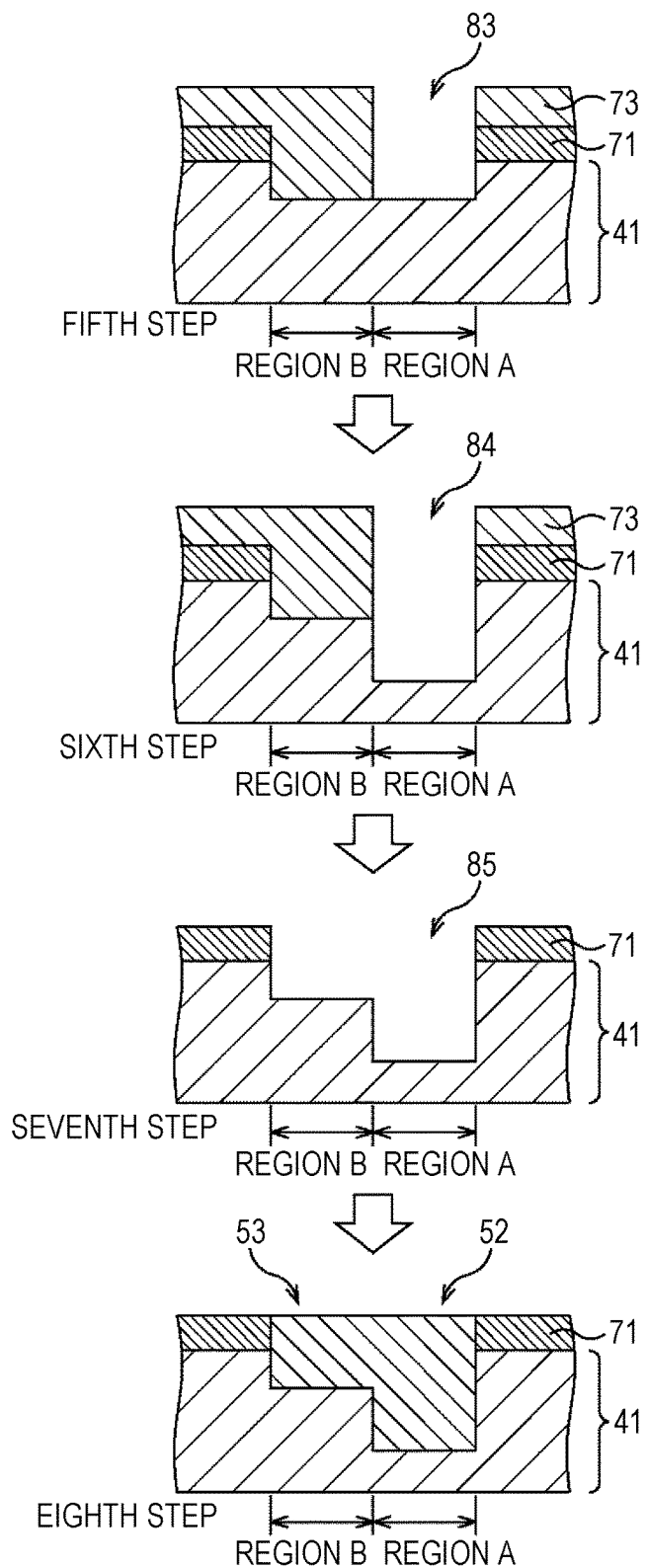
FIG. 6 is a diagram for explaining fifth through eighth steps according to the pixel manufacturing method.

Referring now to FIGS. 5 and 6, a method of manufacturing a pixel 12 having a deep trench element separation region 52 and a shallow trench element separation region 53 is described.

As shown in FIG. 5, in a first step, a hard mask layer 71 that has different reactive properties from those of the insulating film (not shown) in the surface of the silicon substrate 41 and a resist 72 is formed on the surface of the silicon substrate 41. A SiN (silicon nitride) film, a SiO (silicon oxide) film, or the like is used as the hard mask layer 71. After that, the resist 72 is formed on the entire surface of the hard mask layer 71.

In a second step, first patterning is performed to form an opening corresponding to the regions in which the deep trench element separation region 52 and the shallow trench element separation region 53 are to be formed. As a result, an opening 81 corresponding to the region A and the region B is formed in the resist 72, as shown in FIG. 5.

In a third step, first etching is performed to form a trench 82 having the depth of the shallow trench element separation region 53 in the region A and the region B.

In a fourth step, the resist 72 and the polymer remaining due to processing are removed by asking or with DHF (Diluted Hydrogen Fluoride), sulfuric acid diluted with water, ammonia diluted with water, or the like.

As shown in FIG. 6, in a fifth step, after a resist 73 is formed on a front surface of the silicon substrate 41, second patterning is performed to form an opening corresponding to the region in which the deep trench element separation region 52 is to be formed. As a result, an opening 83 corresponding to the region A is formed in the resist 73.

In a sixth step, second etching is performed to form a trench 84 having the depth of the deep trench element separation region 52 in the region A. When the sixth step is carried out, the device separation portion for separating the peripheral circuits (not shown) may be formed at the same time.

In a seventh step, the resist 73 and the polymer remaining due to processing are removed by asking or with DHF (Diluted Hydrogen Fluoride), sulfuric acid diluted with water, ammonia diluted with water, or the like. As a result, a trench 85 having different depths for the respective regions, which are the region A having the depth of the deep trench element separation region 52 and the region B having the depth of the shallow trench element separation region 53, is formed.

In an eighth step, the trench 85 is filled with an oxide film, and flattening is performed by CMP (Chemical Mechanical Polishing). In this manner, the deep trench element separation region 52 corresponding to the region A is formed, and the shallow trench element separation region 53 corresponding to the region B is formed. After that, the hard mask layer 71 is removed.

The process of manufacturing the pixel 12 thereafter is the same as the process according to a conventional method of manufacturing a CIS (CMOS Image Sensor), and a pixel 12 having the cross-section structure shown in FIG. 2 is manufactured. The PD 31 having a HAD structure, and the portion in contact with the shallow trench element separation region 53-1 adjacent to the PD 31 are subjected to boron ion implantation so as to prevent appearance of white dots.

As described above, the first etching and the second etching are performed in this order, to form the trench 85 having different depths for the respective regions. In this manner, the shallow trench element separation region 53 and the deep trench element separation region 52 can be formed.

Figure 7:
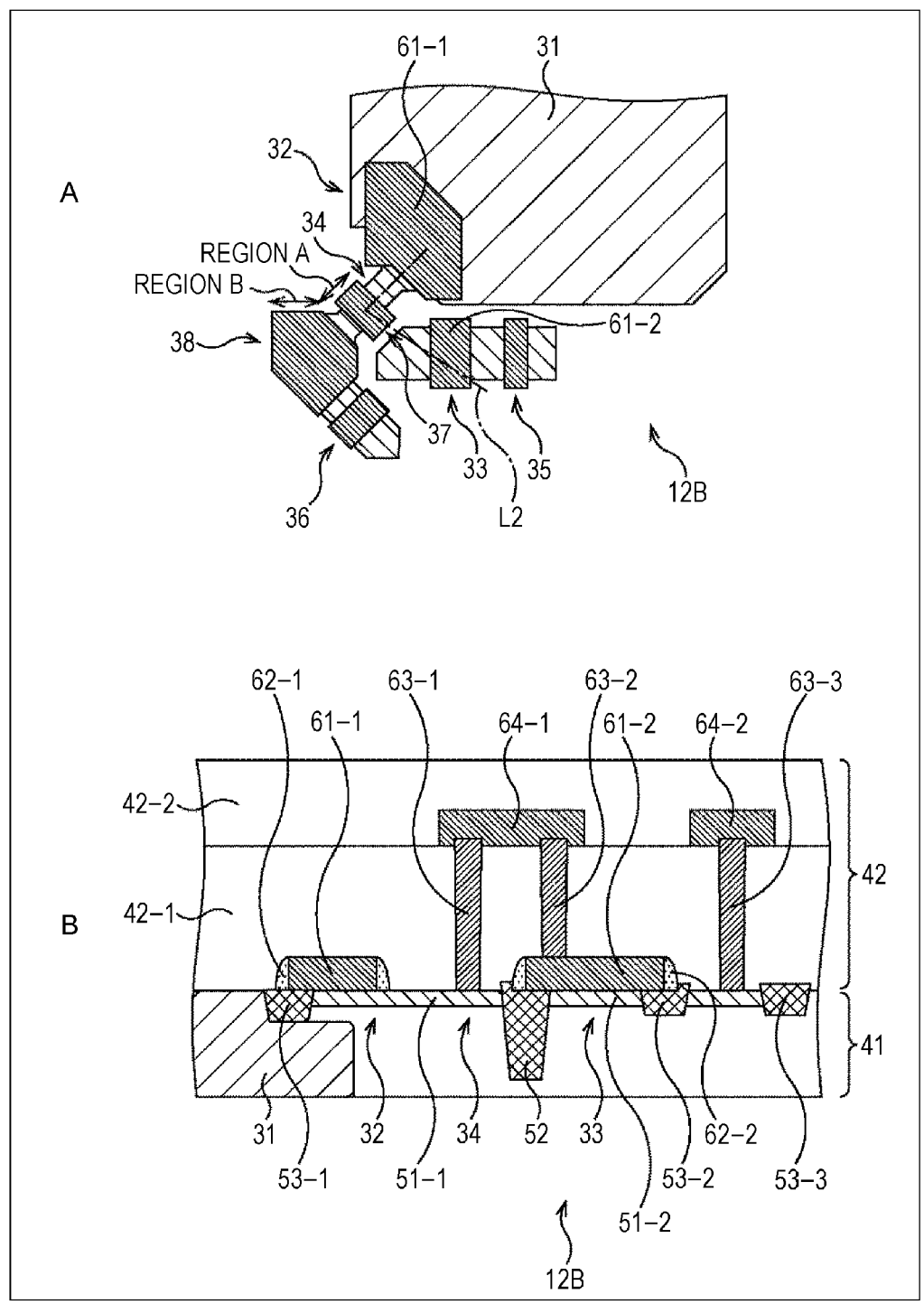
FIG. 7 is a plan view and a cross-sectional diagram showing a third example structure of a pixel.

Referring now to FIG. 7, a third example structure of a pixel 12 is described.

The pixel 12B shown in FIG. 7 has the same circuit configuration as the pixel 12A shown in FIG. 3. A in FIG. 7 is a plan view of the structure of the pixel 12B, and B in FIG. 7 is a cross-sectional view of the structure of the pixel 12B, taken along the dot-and-dash line L2 shown in A in FIG. 7.

As shown in FIG. 7, the pixel 12B is the same as the pixel 12A in FIG. 4 in having a deep trench element separation region 52 between the FD unit 34 and the amplifying transistor 33. However, the pixel 12B differs from the pixel 12A in FIG. 4, in that any deep trench element separation region 52 is not formed between the FD unit 34 and the transfer transistor 32.

That is, a deep trench element separation region 52 is formed at least between the FD unit 34 and the amplifying transistor 33 as in the pixel 12B, so that conversion efficiency can be increased.

Figure 8:
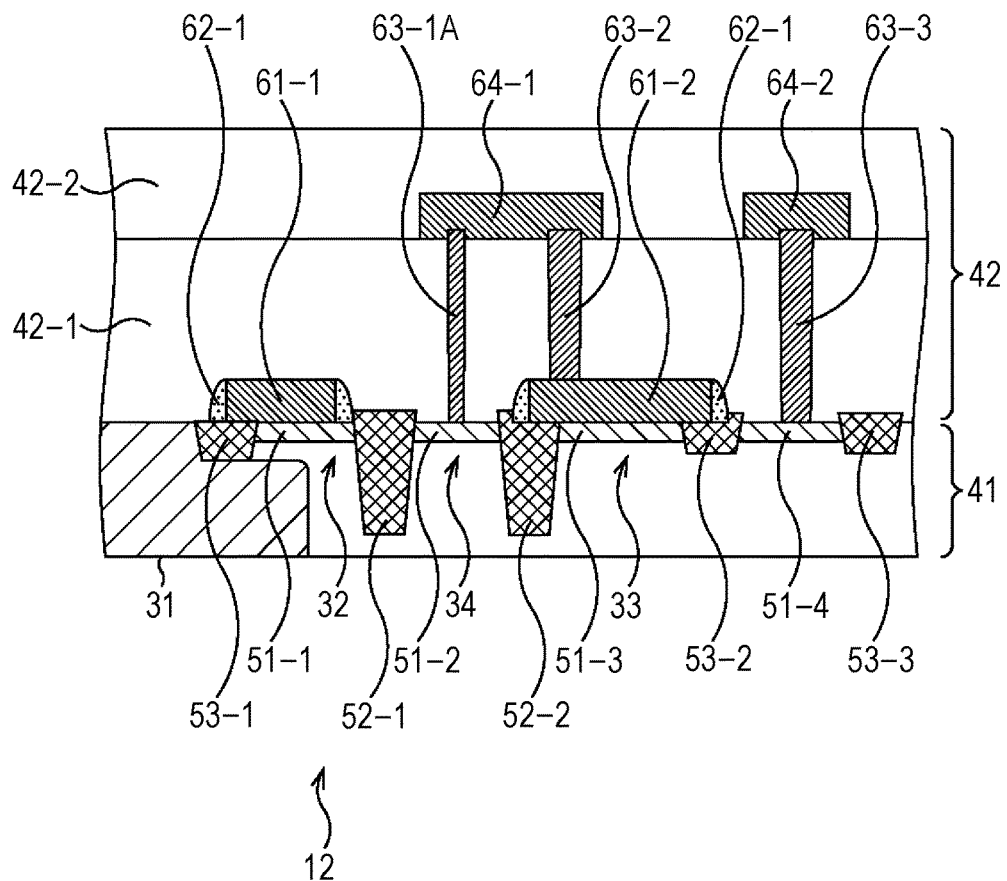
FIG. 8 is a cross-sectional diagram showing a modification of a pixel.

Referring now to FIG. 8, a modification of a pixel 12 is described.

The pixel 12C shown in FIG. 8 differs from the pixel 12 shown in FIG. 2, in that the contact portion 63-1 of the pixel 12 shown in FIG. 2 is replaced with a contact portion 63-1A having a smaller diameter than the contact portion 63-1. The diameter of the contact portion 63-1A is also smaller than the contact portions 63-2 and 63-3. The other aspects of the pixel 12C are the same as those of the pixel 12 shown in FIG. 2, and detailed explanation of them is not repeated herein.

As shown in FIG. 8, in the pixel 12C, the small-diameter contact portion 63-1A is connected to the FD unit 34, so that the charge capacity of the FD unit 34 can be reduced. Accordingly, the gain of the amplifying transistor 33 can be increased.

Since the diameter of the contact portion 63-1A differs from the diameter of the contact portions 63-2 and 63-3, the etching conditions for the respective contact portions are different. Therefore, in the process of manufacturing the pixel 12C, the contact portion 63-1A, and the contact portions 63-2 and 63-3 are formed in two separate steps.

The above described solid-state imaging device 11 can be used in various kinds of electronic apparatuses, such as imaging systems for digital still cameras and digital video cameras, portable telephone devices having imaging functions, and other apparatuses having imaging functions.

Figure 9:
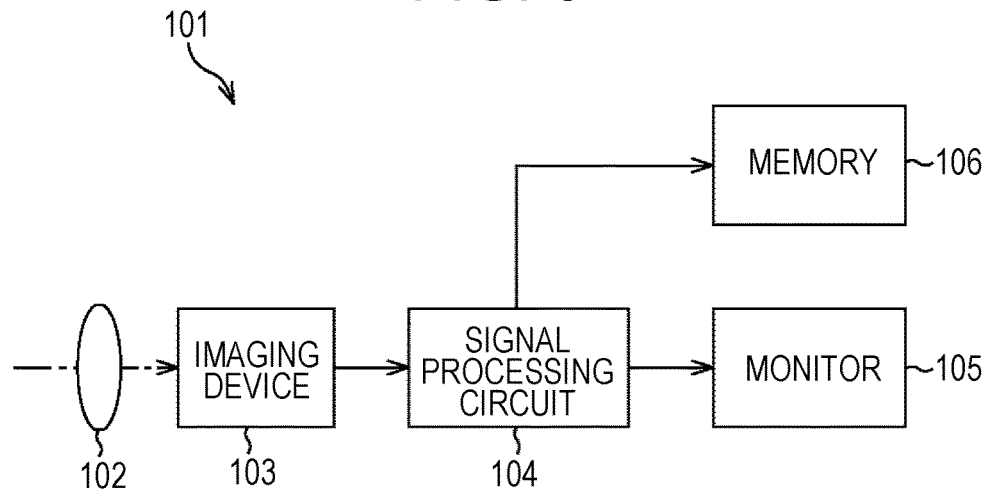
FIG. 9 is a block diagram showing an example structure of an imaging apparatus installed in an electronic apparatus.

FIG. 9 is a block diagram showing an example structure of an imaging apparatus installed in an electronic apparatus.

As shown in FIG. 9, an imaging apparatus 101 includes an optical system 102, an imaging device 103, a signal processing circuit 104, a monitor 105, and a memory 106, and can take still images and moving images.

The optical system 102 includes one or more lenses to guide light (incident light) from an object to the imaging device 103, and form an image on the light receiving surface (the sensor portion) of the imaging device 103.

A solid-state imaging device 11 including pixels 12 each having one of the above described example structures is used as the imaging device 103. In the imaging device 103, electrons are accumulated for a certain period of time in accordance with an image to be formed on the light receiving surface via the optical system 102. A signal in accordance with the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106.

In the imaging apparatus 101 having the above structure, the conversion efficiency in the pixels can be increased by utilizing the above described structure of the solid-state imaging device 11. Accordingly, low-illuminance properties can be improved, and images with higher sensitivity can be formed.

The present technology can also be in the following forms.

(1)

A solid-state imaging device including
a pixel including elements including at least:
a photoelectric conversion unit that converts light into charge;
a transfer transistor that transfers the charge generated at the photoelectric conversion unit;
a floating diffusion region that temporarily accumulates the charge generated at the photoelectric conversion unit; and
an amplifying transistor that amplifies the charge accumulated in the floating diffusion region, and outputs a pixel signal at a level corresponding to the charge,
wherein, in the pixel, element separation is realized by a first trench element separation region having a trench structure in a region between the floating diffusion region and the amplifying transistor among element separation regions separating elements constituting the pixel from one another, and a second trench element separation region having a trench structure in a region other than the region between the floating diffusion region and the amplifying transistor among the element separation regions separating the elements constituting the pixel from one another, and
the first trench element separation region is deeper than the second trench element separation region.

(2)

The solid-state imaging device of (1), wherein the first trench element separation region realizes element separation between the transfer transistor and the floating diffusion region.

(3)

The solid-state imaging device of (1) or (2), further including:
a reset transistor that releases the charge accumulated in the floating diffusion region;
a separation transistor provided between the floating diffusion region and the reset transistor; and
a second floating diffusion region provided at a connecting portion between the reset transistor and the separation transistor,
wherein the first trench element separation region realizes element separation of the second floating diffusion region.

(4)

The solid-state imaging device of any of (1) through (3), wherein a contact portion connecting the floating diffusion region to an interconnect has a smaller diameter than contact portions connecting the interconnect to the other elements constituting the pixel.

It should be noted that this embodiment are not limited to the above described embodiments, and various modifications may be made to them without departing from the scope of the present disclosure.

REFERENCE SIGNS LIST

11 Solid-state imaging device
12 Pixel
13 Array unit
14 Vertical drive circuit
15 Column signal processing circuit
16 Horizontal drive circuit
17 Output circuit
18 Control circuit
19 Vertical signal line
20 Horizontal signal line
31 PD
32 Transfer transistor
33 Amplifying transistor
34 FD unit
35 Select transistor
36 Reset transistor
52-1 and 52-2 Deep trench element separation region
53-1 through 53-3 Shallow trench element separation region

What is claimed is:
1. A solid-state imaging device comprising:
a pixel including elements including at least:
a photoelectric conversion unit configured to convert light into charge;
a transfer transistor configured to transfer the charge generated at the photoelectric conversion unit;

a floating diffusion region configured to temporarily accumulate the charge generated at the photoelectric conversion unit; and an amplifying transistor configured to amplify the charge accumulated in the floating diffusion region, and output a pixel signal at a level corresponding to the charge;

a reset transistor configured to release the charge accumulated in the floating diffusion region;

a separation transistor provided between the floating diffusion region and the reset transistor; and a second floating diffusion region provided at a connecting portion between the reset transistor and the separation transistor, wherein, in the pixel, element separation is realized by a first trench element separation region having a trench structure in a region between the floating diffusion region and the amplifying transistor among element separation regions separating elements constituting the pixel from one another, and a second trench element separation region having a trench structure in a region other than the region between the floating diffusion region and the amplifying transistor among the element separation regions separating the elements constituting the pixel from one another, wherein the first trench element separation region is deeper than the second trench element separation region, and wherein the first trench element separation region realizes element separation of the second floating diffusion region.

2. The solid-state imaging device according to claim 1, wherein the first trench element separation region realizes element separation between the transfer transistor and the floating diffusion region.

3. A solid-state imaging device comprising:
a pixel including elements including at least:
a photoelectric conversion unit configured to convert light into charge;
a transfer transistor configured to transfer the charge generated at the photoelectric conversion unit;
a floating diffusion region configured to temporarily accumulate the charge generated at the photoelectric conversion unit; and
an amplifying transistor configured to amplify the charge accumulated in the floating diffusion region, and output a pixel signal at a level corresponding to the charge,
wherein, in the pixel, element separation is realized by a first trench element separation region having a trench structure in a region between the floating diffusion region and the amplifying transistor among element separation regions separating elements constituting the pixel from one another, and a second trench element separation region having a trench structure in a region other than the region between the floating diffusion region and the amplifying transistor among the element separation regions separating the elements constituting the pixel from one another, wherein the first trench element separation region is deeper than the second trench element separation region, and wherein a contact portion connecting the floating diffusion region to an interconnect has a smaller diameter than contact portions connecting the interconnect to the other elements constituting the pixel.

4. The solid-state imaging device according to claim 3, wherein the first trench element separation region realizes element separation between the transfer transistor and the floating diffusion region.

5. An electronic apparatus comprising a solid-state imaging device,
the solid-state imaging device comprising:
a pixel including elements including at least:
a photoelectric conversion unit configured to convert light into charge;
a transfer transistor configured to transfer the charge generated at the photoelectric conversion unit;
a floating diffusion region configured to temporarily accumulate the charge generated at the photoelectric conversion unit;
an amplifying transistor configured to amplify the charge accumulated in the floating diffusion region, and output a pixel signal at a level corresponding to the charge;
a reset transistor configured to release the charge accumulated in the floating diffusion region;
a separation transistor provided between the floating diffusion region and the reset transistor; and
a second floating diffusion region provided at a connecting portion between the reset transistor and the separation transistor,
wherein, in the pixel, element separation is realized by a first trench element separation region having a trench structure in a region between the floating diffusion region and the amplifying transistor among element separation regions separating elements constituting the pixel from one another, and a second trench element separation region having a trench structure in a region other than the region between the floating diffusion region and the amplifying transistor among the element separation regions separating the elements constituting the pixel from one another, wherein the first trench element separation region is deeper than the second trench element separation region, and wherein the first trench element separation region realizes element separation of the second floating diffusion region.

* * * * *